US 7,755,431 B2

(12) United States Patent
Sun

(10) Patent No.: US 7,755,431 B2
(45) Date of Patent: Jul. 13, 2010

(54) APPARATUS FOR POWER AMPLIFICATION BASED ON ENVELOPE ELIMINATION AND RESTORATION (EER) AND PUSH-PULL SWITCHING

(75) Inventor: Kae-Oh Sun, Uiwang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 40 days.

(21) Appl. No.: 12/343,684

(22) Filed: Dec. 24, 2008

(65) Prior Publication Data

US 2009/0160555 A1  Jun. 25, 2009

(30) Foreign Application Priority Data

Dec. 24, 2007  (KR) .................... 10-2007-0136223

(51) Int. Cl.
*H03F 3/04* (2006.01)
(52) U.S. Cl. ....................... 330/297; 330/127
(58) Field of Classification Search .............. 330/10, 330/297, 127, 207 A, 251; 455/127.1
See application file for complete search history.

(56) References Cited

U.S. PATENT DOCUMENTS

| 5,905,407 | A  | * | 5/1999  | Midya ........................ 330/10 |
| 6,838,931 | B2 | * | 1/2005  | Midya et al. ................. 330/10 |
| 7,116,947 | B2 | * | 10/2006 | Tanabe et al. ................ 455/91 |

* cited by examiner

*Primary Examiner*—Robert Pascal
*Assistant Examiner*—Hieu P Nguyen
(74) *Attorney, Agent, or Firm*—Jefferson IP Law, LLP

(57) ABSTRACT

A power amplifying apparatus based on envelope elimination and restoration (EER) includes a voltage amplifier to amplify a high frequency component of an envelope signal, a switching amplifier to generate a low frequency component signal of a drain bias based on a first pulse width modulation (PWM) signal that corresponds to a low frequency component of the envelope signal, and a push-pull switch, connected to the switching amplifier in parallel, to add a high frequency component signal to an output of the switching amplifier by pushing or pulling current to or from the output of the switching amplifier.

17 Claims, 6 Drawing Sheets

APPARATUS FOR POWER AMPLIFICATION BASED ON ENVELOPE ELIMINATION AND RESTORATION (EER) AND PUSH-PULL SWITCHING

PRIORITY

This application claims the benefit under 35 U.S.C. §119(a) to a Korean patent application filed in Korean on Dec. 24, 2007 and assigned Application No. 10-2007-0136223, the entire disclosure of which is hereby incorporated by reference.

BACKGROUND OF THE INVENTION

1. Field of the Invention

The present invention relates generally to a power amplifier. More particularly, the present invention relates to a power amplifying apparatus based on envelope elimination and restoration (EER) using push-pull switching.

2. Description of the Related Art

A power amplifier (PA) is generally used to amplify a transmit signal in a wireless communication system. In terms of cost, the PA is given a great deal of weight. Many developers of wireless communication systems are making efforts to develop a PA with high efficiency. Yet, it is not easy to develop a PA satisfying all of high efficiency, broad band, and high power requirements. To raise the efficiency of the PA, envelope tracking (ET) and envelope elimination and restoration (EER) have been suggested. However, it is hard to enhance both the efficiency and the band characteristic because of the high-level implementation.

The PA based on the EER approach is constructed as shown in FIG. 1. An envelope detector 110 detects and outputs an envelope of an input radio frequency (RF) signal, and a phase detector 120 detects and outputs a phase of the input RF signal. Namely, the RF signal is amplified separately in the amplitude and the phase. The drain bias of a switching mode PA 140, which amplifies the phase, is the output of an envelope amplifier 130. Hence, when the switching mode PA 140 operates in the saturation mode, the envelope of the output of the switching mode PA 140 conforms to the output of the envelope amplifier 130.

As shown in FIG. 2, the envelope amplifier 130 includes a voltage amplifier 210, a resistor 220, an operational (OP) amplifier 230, and a switching amplifier 240. The voltage amplifier 210 has a class-B push-pull structure in general and behaves as a voltage source. The class-B push-pull amplifier generally exhibits low efficiency but can be designed to achieve a wide bandwidth. The output of the OP amplifier 230 is determined by the direction of current flowing through the resistor 220. A control signal of the switching amplifier 240 is a pulse width modulation (PWM) signal. The switching amplifier 240 may employ a buck converter, which behaves as a current source. When the control signal of the switching amplifier 240 is positive, a switch 242 in the switching amplifier 240 is in the on-state, and the current flowing through the inductor 244 increases. Conversely, when the control signal of the switching amplifier 240 is negative, the switch 242 is in the off-state, and the current flowing through the inductor 244 decreases.

Typically, a buck converter has a relatively high efficiency of over 80%. However, as the switching frequency gets higher, loss also increases, thereby rendering the buck converter as being unsuitable for high frequency operations. Therefore, the envelope amplifier 130 includes the switching amplifier 240 for processing the low frequency band of the signal and the voltage amplifier 210 for processing the high frequency band of the signal. When detecting the envelope of the RF signal, since the bandwidth increases by more than two times the baseband signal, the overall performance of the envelope amplifier 130 is greatly influenced by the amplification efficiency of the low frequency band. Since the efficiency of the switching amplifier 240 is relatively high, when the switching amplifier 240 is able to process signals in the band as wide as possible, the total performance of the PA is enhanced. However, as the switching frequency of the signal fed to the switching amplifier 240 gets higher, the loss increases, thereby degrading the total efficiency instead.

SUMMARY OF THE INVENTION

An aspect of the present invention is to address at least the above mentioned problems and/or disadvantages and to provide at least the advantages described below. Accordingly, an aspect of the present invention is to provide an apparatus for enhancing efficiency of a power amplifier (PA) based on envelope elimination and restoration (EER).

Another aspect of the present invention is to provide an apparatus for enhancing efficiency of an envelope amplifier in a PA based on EER.

Yet another aspect of the present invention is to provide an apparatus for increasing a processing frequency band of a switching amplifier of an envelope amplifier in a PA based on EER.

The above aspects are achieved by providing a power amplifying apparatus based on envelope elimination and restoration (EER) that includes a voltage amplifier to amplify a high frequency component of an envelope signal, a switching amplifier to generate a low frequency component signal of a drain bias based on a first pulse width modulation (PWM) signal that corresponds to a low frequency component of the envelope signal, and a push-pull switch, connected to the switching amplifier in parallel, to add a high frequency component signal to an output of the switching amplifier by pushing or pulling current to or from the output of the switching amplifier.

According to another aspect of the present invention, a power amplifying method based on envelope elimination and restoration (EER) includes amplifying a high frequency component of an envelope signal by a voltage amplifier, generating a low frequency component signal of a drain bias based on a first pulse width modulation (PWM) signal that corresponds to a low frequency component of the envelope signal by a switching amplifier, and adding a high frequency component signal to an output of the switching amplifier by pushing or pulling current to or from the output of the switching amplifier by a push-pull switch connected to the switching amplifier in parallel.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments the present invention will become more apparent from the following detailed description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the present invention as defined by the claims and their equivalents. It includes various details to assist in that understanding but these are to be regarded as merely exemplary. Accordingly, those of ordinary skill in the art will recognize that various changes and modifications of the embodiments described herein can be made without departing from the scope and spirit of the invention.

Figure 1:
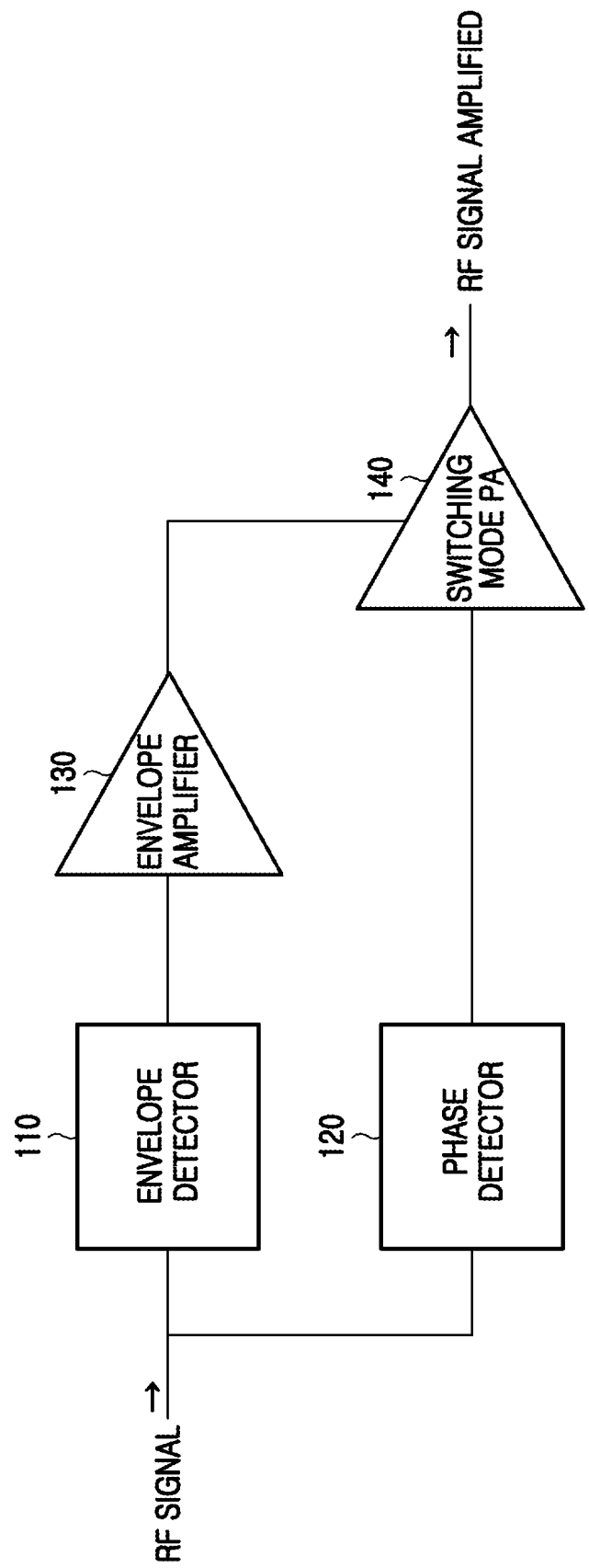
FIG. 1 illustrates a conventional power amplifier (PA) based on envelope elimination and restoration (EER)
Figure 2:
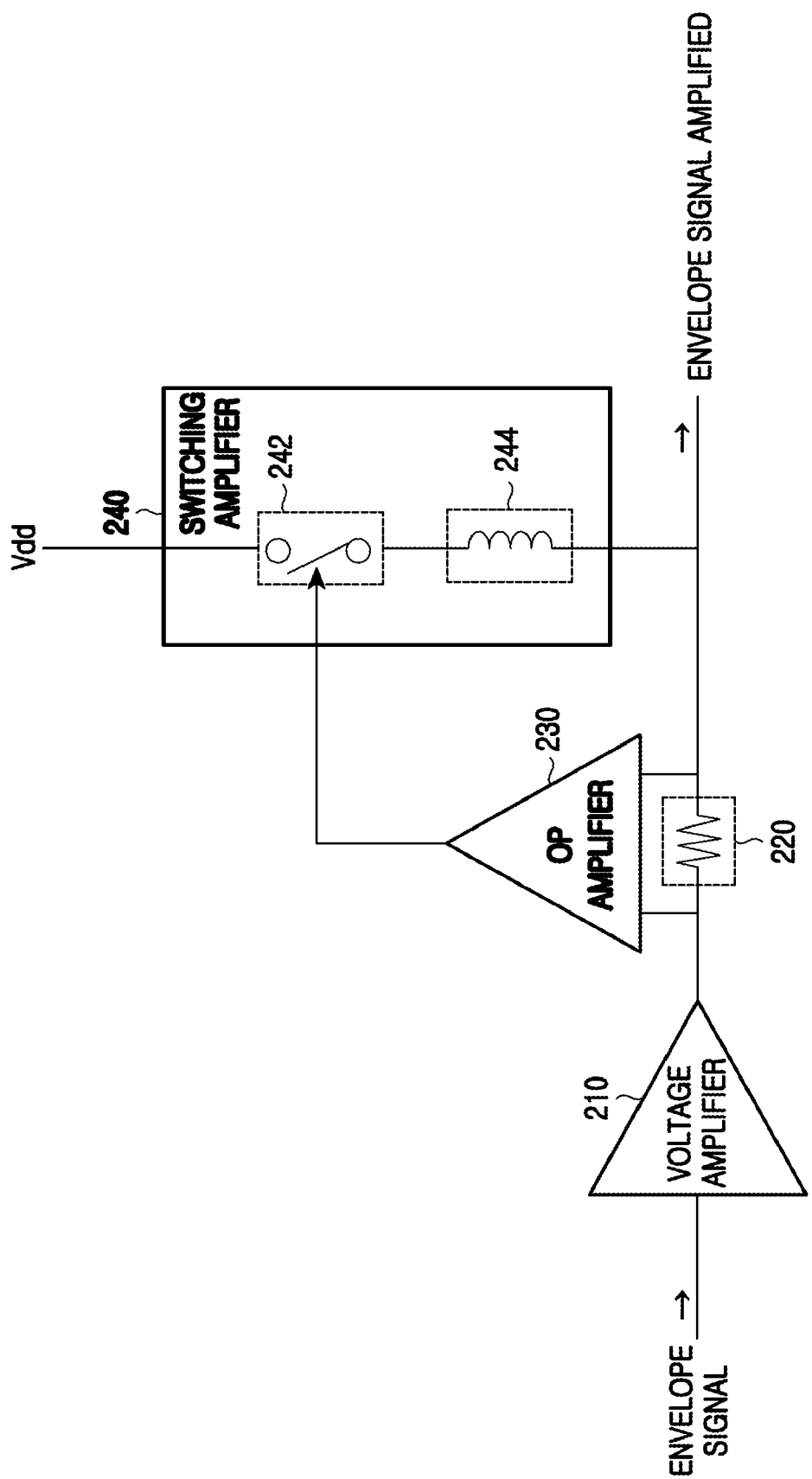
FIG. 2 illustrates an envelope amplifier in the conventional PA based on EER.
Figure 3:
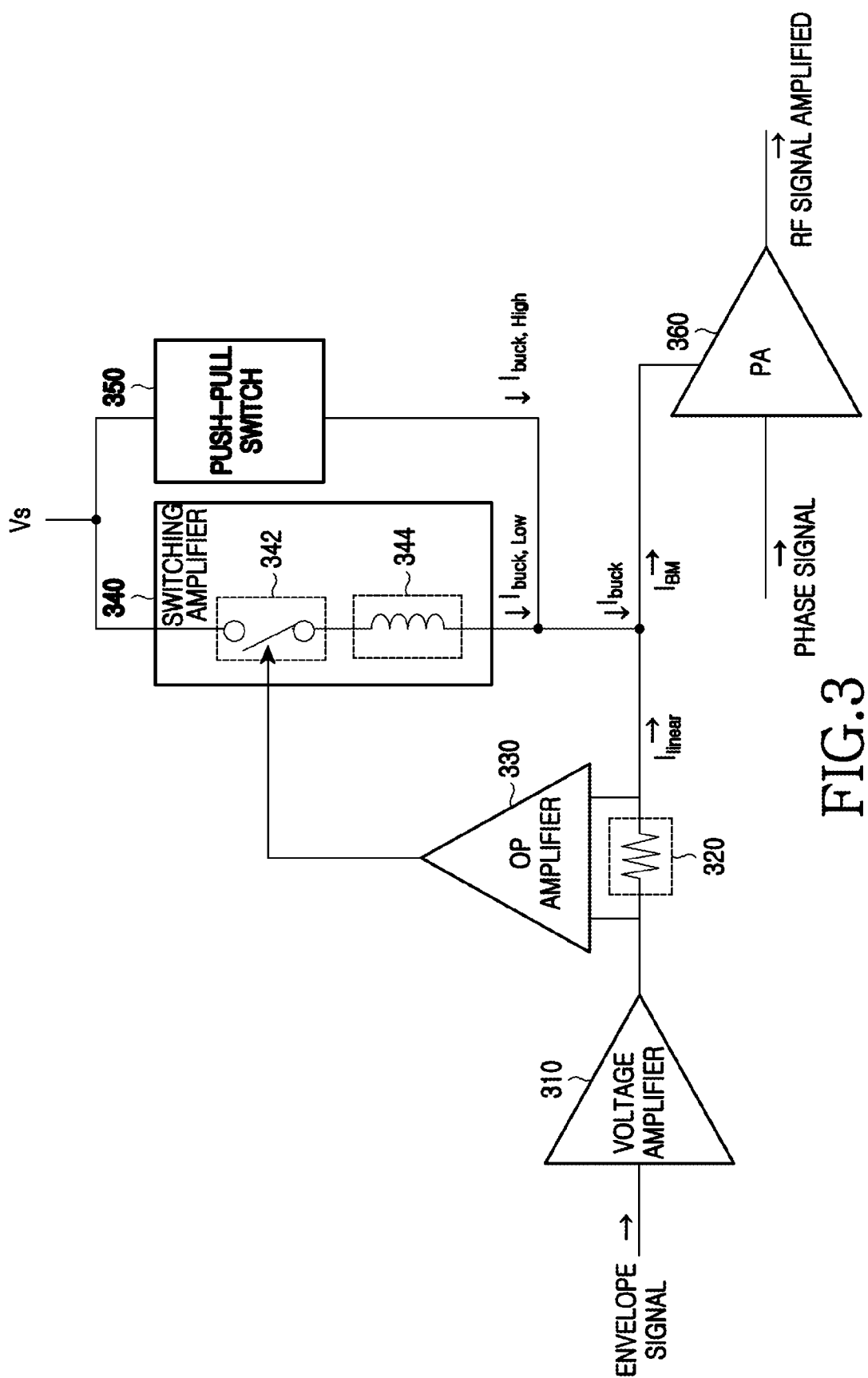
FIG. 3 illustrates an envelope amplifier in a PA based on EER according to an exemplary embodiment of the present invention.

FIG. 3 illustrates a power amplifying apparatus based on envelope elimination and restoration (EER) according to an exemplary embodiment of the present invention. The power amplifying apparatus of FIG. 3 includes a voltage amplifier 310, a resistor 320, an operational (OP) amplifier 330, a switching amplifier 340, a push-pull switch 350, and a power amplifier (PA) 360.

The voltage amplifier 310 amplifies a high frequency component of an envelope signal. For example, the voltage amplifier 310 may be implemented using a class-B push-pull amplifier. The OP amplifier 330 outputs a pulse width modulation (PWM) signal which varies based on the direction of current flowing through the resistor 320. For example, when IBM is greater than $I_{buck}$, $I_{linear}$ flows in the forward direction. Accordingly, the OP amplifier 330 outputs a positive signal. When $I_{BM}$ is less than $I_{buck}$, $I_{linear}$ flows in the reverse direction and the OP amplifier 330 outputs a negative signal. Herein, the output of the OP amplifier 330 is fed as a control signal to the switching amplifier 340.

The switching amplifier 340 generates a low frequency component of the amplified envelope signal using the control signal, i.e., the PWM signal corresponding to the low frequency component of the envelope signal, fed from the OP amplifier 330. The switching amplifier 340 is connected to a direct current (DC) voltage source. The switching amplifier 340 includes a switch 342 that switches on and off according to the PWM signal and an inductor 344 connected to the switch 342 in serial. When the control signal is positive, the switch 342 of the switching amplifier 340 is switched on and the current flowing through the inductor 344 gradually increases. Conversely, when the control signal of the switching amplifier 340 is negative, the switch 342 is switched off and the current flowing through the inductor 344 gradually decreases. The switching amplifier 340 may be implemented using, for example, a buck converter.

The push-pull switch 350 is connected to the switching amplifier 340 in parallel. The push-pull switch 350 generates a high frequency component of $I_{buck}$ that cannot be generated by the switching amplifier 340 due to fast switching operation. In other words, the push-pull switch 350 expands the frequency band occupied by $I_{buck}$ in $I_{BM}$ by adding or subtracting the current to or from the output $I_{buck,Low}$ of the switching amplifier 340. To push the current to $I_{buck,Low}$, the push-pull switch 350 provides a forward $I_{buck,High}$. To pull the currents from $I_{buck,Low}$, the push-pull switch 350 provides a reverse $I_{buck,High}$.

The PA 360 amplifies the phase signal of a radio frequency (RF) signal using a current incorporating the output of the voltage amplifier 310, the output of the switching amplifier 340, and the output of the push-pull switch 350 as a drain bias.

In the power amplifying apparatus of FIG. 3, the resistor 320 and the OP amplifier 330 are provided to generate the control signal of the switching amplifier 340. The resistor 320 and the OP amplifier 330 are used to generate the control signal of the switching amplifier 340 as shown in FIG. 3 by way of example. Other elements to substitute the resistor 320 and the OP amplifier 330 may be used in various alternative implementations without departing from the scope of the present invention.

Figure 4:
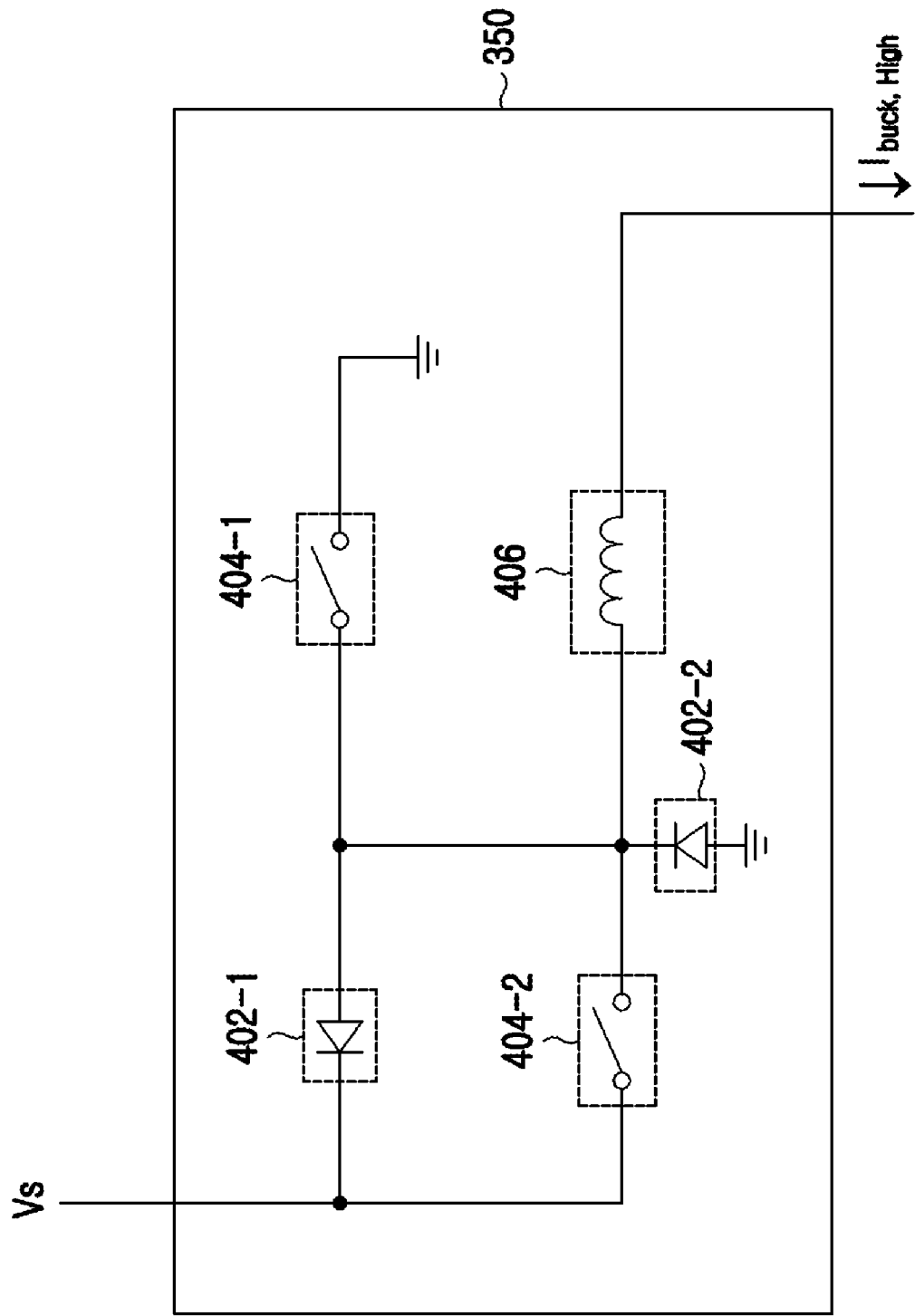
FIG. 4 illustrates a push-pull switch according to an exemplary embodiment of the present invention.

FIG. 4 illustrates a push-pull switch according to an exemplary embodiment of the present invention.

The push-pull switch 350 of FIG. 4 includes a first diode 402-1, a second diode 402-2, a first switch 404-1, a second switch 404-2, and an inductor 406. The first diode 402-1 is connected to the DC voltage source in a forward direction. The first switch 404-1 is arranged between the opposite terminal of the first diode 402-1 and ground. The second switch 404-2 is connected to the first diode 402-1 in parallel. The forward direction of the second diode 402-2 is connected to the first diode 402-1 and the second switch 404-2. The reverse direction of the second diode 402-2 leads to ground. The inductor 406 is connected to the forward terminal of the second diode 404-2.

$I_{bulk,High}$ varies depending on the conditions of the first switch 404-1 and the second switch 404-2. For purposes of explanation, it is assumed that the first switch 404-1 and the second switch 404-2 are controlled by $I_{buck,High}$ to be provided. When $I_{buck,High}$ is unnecessary; that is, when the current is not pushed to or pulled from the output of the switching amplifier 340, the first switch 404-1 and the second switch 404-2 are in the off-state.

Figure 5B:
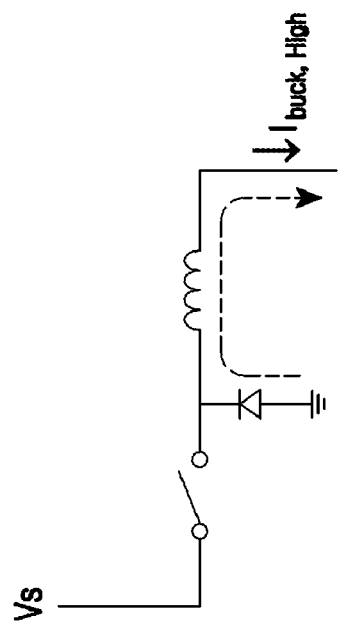
FIGS. 5A-5D illustrate various equivalent circuits according to an operation of the push-pull switch in the envelope amplifier according to an exemplary embodiment of the present invention.
Figure 5D:
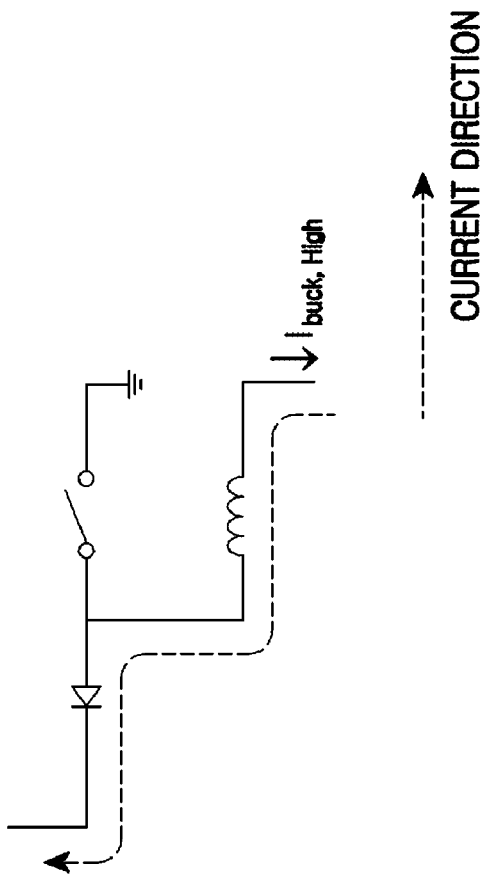
Figure 5A:
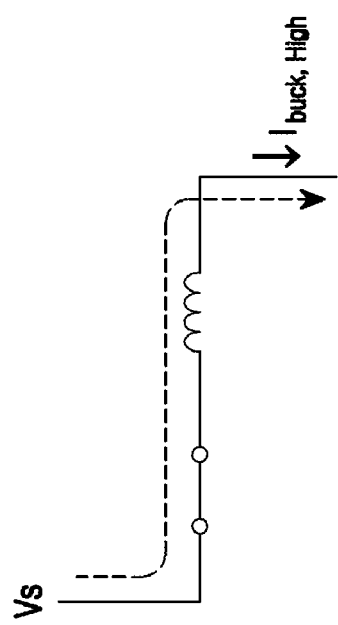

To provide forward $I_{buck,High}$, the first switch 404-1 maintains the off-state and the second switch 404-2 transitions to the on-state. Thus, the current $I_{buck,High}$ flowing through the inductor 406 gradually increases in the forward direction. An equivalent circuit of the push-pull switch 350 in this operation is shown in FIG. 5A. To decrease the forward $I_{buck,High}$, the second switch 404-2 transitions from the on-state to the off-state. Accordingly, the current loop through the second diode 402-2 is established and the current $I_{buck,High}$ flowing through the inductor 406 gradually decreases. The equivalent circuit of the push-pull switch 350 of this operation is shown in FIG. 5B.

Figure 5C:
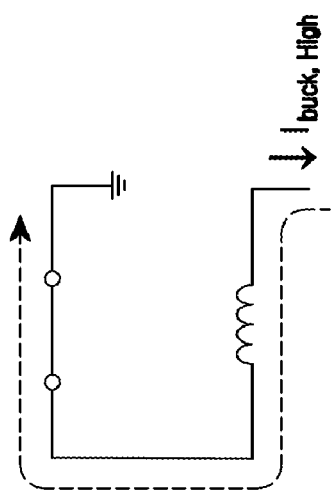

To provide reverse $I_{buck,High}$, the second switch 404-2 maintains the off-state and the first switch 404-1 transitions to the on-state. Accordingly, the current $I_{buck,High}$ flowing through the inductor 406 gradually increases in the reverse direction. The equivalent circuit of the push-pull switch 350 of this operation is shown in FIG. 5C. To decrease the reverse $I_{buck,High}$, the first switch 404-1 transitions from the on-state to the off-state. Thus, the current loop through the first diode 402-1 is established and the current $I_{buck,High}$ flowing through the inductor 406 gradually decreases. The equivalent circuit of the push-pull switch 350 of this operation is shown in FIG. 5D.

In the push-pull switch 350 as shown in FIG. 4, the first diode 402-1 and the second diode 402-2 block or pass the current according to the current direction. In various alternative embodiments, the first diode 402-1 and the second diode 402-2 may be substituted by switches without departing from the scope of the invention. In particular, switches may be inserted in the place of the first diode 402-1 and the second diode 402-2 and controlled to enter the on-state in order to allow the current to pass as shown in FIGS. 5B and 5D and to enter the off-state to block the current as shown in FIGS. 5A and 5C.

As explained above in reference to FIG. 3, the push-pull switch 350 of FIG. 4 generates the high frequency component of $I_{buck}$ that does not get generated by the switching amplifier 340. Therefore, the push-pull switch 350 needs to operate faster than the switching amplifier 340. Accordingly, the inductance of inductor 406 of the push-pull switch 350 is less than the inductance of inductor 344 of the switching amplifier 340. More specifically, the inductance of the inductor 406 of the push-pull switch 350 may be set to about 0.5 µH, and the inductance of the inductor 344 of the switching amplifier 340 may be set to 20 µH.

Figure 6:
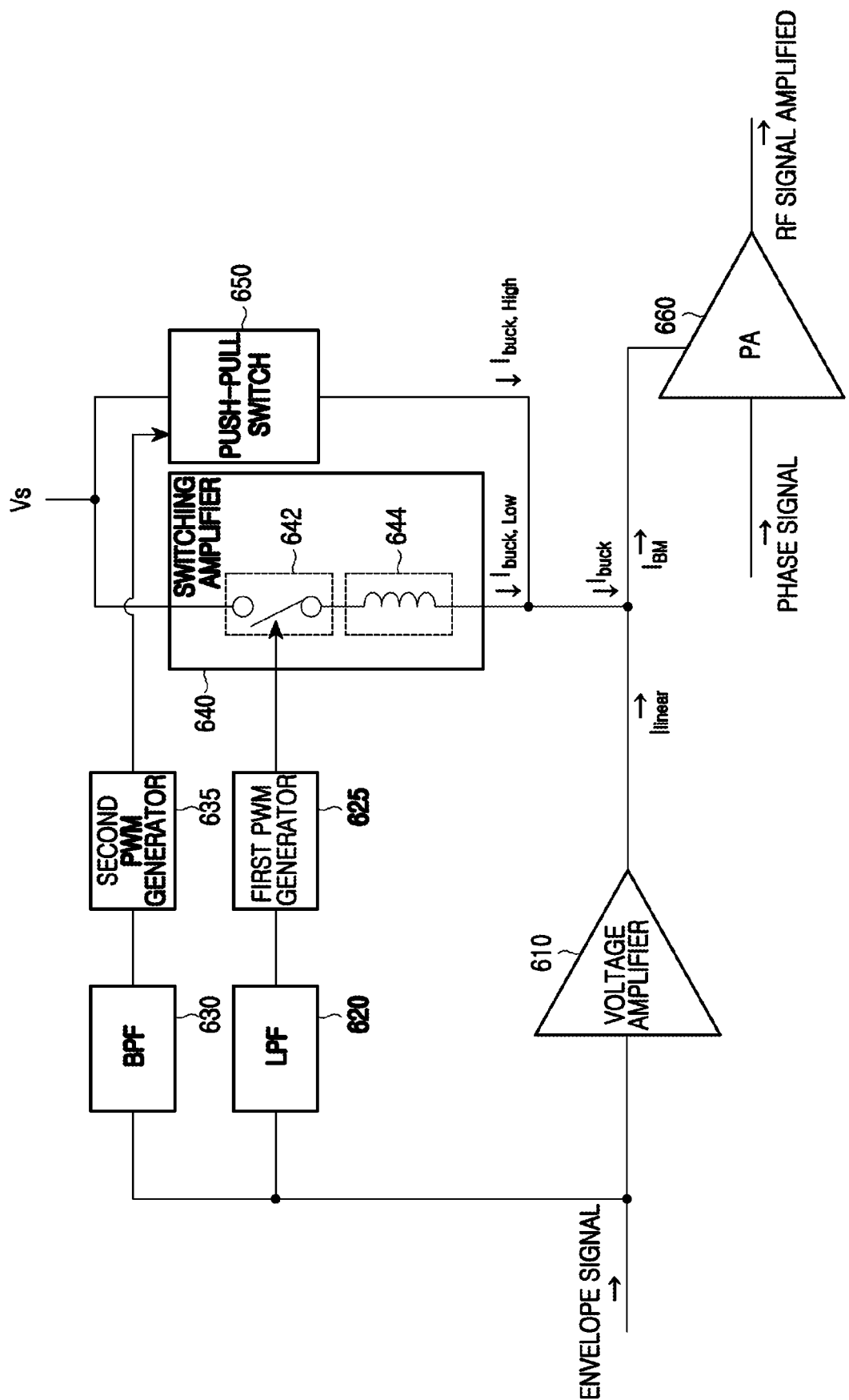
FIG. 6 illustrates an envelope amplifier in a PA based on EER according to another exemplary embodiment of the present invention.

FIG. 6 is a block diagram of a power amplifying apparatus based on EER according to another exemplary embodiment of the present invention. The power amplifying apparatus of FIG. 6 includes a voltage amplifier 610, a low pass filter (LPF) 620, a first PWM generator 625, a band pass filter (BPF) 630, a second PWM generator 635, a switching amplifier 640, a push-pull switch 650, and a PA 660.

The voltage amplifier 610 amplifies a high frequency component of an envelope signal. For example, the voltage amplifier 610 may be implemented using a class-B push-pull amplifier.

The LPF 620 passes the low frequency band of the envelope signal and outputs a low frequency component signal of the envelope signal. The first PWM generator 625 generates a first PWM signal corresponding to the low frequency component. That is, the first PWM generator 625 generates the first PWM signal to control the switching operation of the switching amplifier 640 according to the low frequency component of the envelope signal. More specifically, the first PWM generator 625 generates the first PWM signal including a positive signal in the interval of the increasing low frequency component signal and a negative signal in the interval of the decreasing low frequency component signal.

The BPF 630 outputs a specific band component signal of the envelope signal by filtering the envelope signal. Here, the specific band is higher than the band of signal output from the LPF 620 and lower than the high frequency component amplified by the voltage amplifier 610. For explanation purposes only, this specific band is referred to as an intermediate band hereinafter. The second PWM generator 635 generates a second PWM signal corresponding to the intermediate band component. The second PWM generator 635 generates the second PWM signal to control the switching operation of the push-pull switch 650 according to the intermediate band component of the envelope signal. More specifically, the second PWM generator 635 generates the second PWM signal including a positive signal in the interval of the increasing intermediate band component signal and a negative signal in the interval of the decreasing intermediate band component signal.

The switching amplifier 640 generates a low frequency component of the amplified envelope signal according to the control signal fed from the first PWM generator 625; that is, according to the first PWM signal corresponding to the low frequency component of the envelope signal. The switching amplifier 640 is connected to a DC voltage source. The switching amplifier 640 includes a switch 642 that switches on and off using the first PWM signal as the control signal, and an inductor 644 connected to the switch 642 in serial. When the control signal is positive, the switch 642 of the switching amplifier 640 is switched on and the current flowing through the inductor 644 gradually increases. Conversely, when the control signal is negative, the switch 642 is switched off and the current flowing through the inductor 644 gradually decreases. The switching amplifier 640 may be implemented using, for example, a buck converter.

The push-pull switch 650 is connected to the switching amplifier 640 in parallel. The push-pull switch 650 generates the high frequency component of $I_{buck}$, which does not get generated by the switching amplifier 640 during fast switching operations according to the second PWM signal provided from the second PWM generator 635; that is, according to the second PWM signal corresponding to the intermediate band component of the envelope signal. In other words, the push-pull switch 650 expands the frequency band occupied by $I_{buck}$ in $I_{BM}$ by pushing or pulling the current to or from the output $I_{buck,Low}$ of the switching amplifier 640, respectively. To push the current to $I_{buck,Low}$, the push-pull switch 650 provides a forward $I_{buck,High}$. To pull the currents from $I_{buck,Low}$, the push-pull switch 350 provides a reverse $I_{buck,High}$.

One exemplary detailed structure of the push-pull switch 650 is shown in FIG. 4. The first switch 440-1 and the second switch 440-2 are switched on and off using the second PWM signal as the control signal. When the control signal is positive, the first switch 440-1 transits to the off-state, the second switch 440-2 transits to the on-state, and the forward $I_{buck,High}$ is produced. When the control signal is negative, the first switch 440-1 transits to the on-state, the second switch 440-2 transits to the off-state, and the reverse $I_{buck,High}$ is produced.

The PA 660 amplifies the phase signal of the RF signal using the current based on the output of the voltage amplifier 610, the output of the switching amplifier 640, and the output of the push-pull switch 650 as its drain bias.

In light of the foregoing, a PA based on EER with a push-pull switch in accordance with the present invention provides expanded processing frequency band of the switching amplifier of the envelope amplifier and enhanced total amplifier efficiency.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A power amplifying apparatus based on envelope elimination and restoration (EER), comprising:
   a voltage amplifier to amplify a high frequency component of an envelope signal;
   a switching amplifier to generate a low frequency component signal of a drain bias based on a first pulse width modulation (PWM) signal that corresponds to a low frequency component of the envelope signal; and
   a push-pull switch, connected to the switching amplifier in parallel, to add a high frequency component signal to an output of the switching amplifier by pushing or pulling current to or from the output of the switching amplifier.

2. The power amplifying apparatus of claim 1 further comprising:

a low pass filter (LPF) to pass the low frequency component of the envelope signal; and a first PWM generator to generate the first PWM signal according to the low frequency component of the envelope signal.

3. The power amplifying apparatus of claim 1 further comprising:

a band pass filter (BPF) to pass an intermediate frequency component of the envelope signal; and a second PWM generator to generate a second PWM signal according to the intermediate frequency component of the envelope signal to control the push-pull switch.

4. The power amplifying apparatus of claim 1, wherein the switching amplifier includes a switch connected to a direct current (DC) voltage source to switch on or off according to the first PWM signal, and an inductor connected to the switch in serial.

5. The power amplifying apparatus of claim 1, wherein the push-pull switch includes a first diode connected to a DC voltage source, a first switch interposed between the first diode and ground, a second switch connected to the first diode in parallel, a second diode connected to the first diode and the second switch in a forward direction and connected to ground in a reverse direction, and an inductor connected to the first diode, the second diode, the first switch, and the second switch.

6. The power amplifying apparatus of claim 5, wherein the first switch and the second switch are switched on and off according to a second PWM signal that is generated based on an intermediate frequency component of the envelope signal.

7. The power amplifying apparatus of claim 1, further comprising:

a power amplifier (PA) to amplify a phase signal of a radio frequency (RF) signal using current output from the voltage amplifier, the switching amplifier, and the push-pull switch as the drain bias.

8. The power amplifying apparatus of claim 1, wherein the voltage amplifier is a B class push-pull amplifier.

9. The power amplifying apparatus of claim 1, wherein the switching amplifier is a buck converter.

10. A power amplifying method based on envelope elimination and restoration (EER), the method comprising:

amplifying a high frequency component of an envelope signal by a voltage amplifier;

generating a low frequency component signal of a drain bias based on a first pulse width modulation (PWM) signal that corresponds to a low frequency component of the envelope signal by a switching amplifier; and adding a high frequency component signal to an output of the switching amplifier by pushing or pulling current to or from the output of the switching amplifier by a push-pull switch connected to the switching amplifier in parallel.

11. The power amplifying method of claim 10 further comprising:

passing the low frequency component of the envelop signal through a low pass filter (LPF); and generating the first PWM signal by a first PWM generator according to the low frequency component of the envelop signal.

12. The power amplifying method of claim 10 further comprising:

passing an intermediate frequency component of the envelop signal through a band pass filter (BPF); and generating a second PWM signal by a second PWM generator according to the intermediate frequency component of the envelope signal to control the push-pull switch.

13. The power amplifying method of claim 10, wherein generating the low frequency component signal by the switching amplifier includes switching a connection between a direct current (DC) voltage source and an inductor of the switching amplifier on and off according to the first PWM signal.

14. The power amplifying method of claim 10, wherein adding the high frequency component signal by the push-pull switch includes generating current in an inductor connected to a forward terminal of a second diode by switching on and off a first switch interposed between an opposite terminal of a first diode connected to a direct current (DC) voltage source in the forward direction and ground and a second switch connected to the first diode in parallel and connected to the forward terminal of the second diode connected to the ground in a reverse direction according to a second PWM signal that is generated based on an intermediate frequency component of the envelope signal.

15. The power amplifying method of claim 10, further comprising:

amplifying a phase signal of a radio frequency (RF) signal using current output from the voltage amplifier, the switching amplifier, and the push-pull switch as the drain bias.

16. The power amplifying method of claim 10, wherein the voltage amplifier is a B class push-pull amplifier.

17. The power amplifying method of claim 10, wherein the switching amplifier is a buck converter.

* * * * *